(12) United States Patent
Caldwell et al.

(10) Patent No.: US 6,408,610 B1
(45) Date of Patent: Jun. 25, 2002

(54) METHOD OF ADJUSTING GAS TURBINE COMPONENT COOLING AIR FLOW

(75) Inventors: James M. Caldwell, Alexandria, KY (US); Gilbert Farmer, Cincinnati, OH (US); Karl S. Fessenden, Wilder, KY (US); Xuenan Wang, Loveland; Jerald M. Kauffman, Middletown, both of OH (US)

(73) Assignee: General Electric Company, Cincinnati, OH (US)

( * ) Notice: Subject to any disclaimer, the term of this patent is extended or adjusted under 35 U.S.C. 154(b) by 26 days.

(21) Appl. No.: 09/618,571

(22) Filed: Jul. 18, 2000

(51) Int. Cl.$^7$ .................................................. F02C 7/12
(52) U.S. Cl. ......................... 60/39.02; 60/754; 29/889.2
(58) Field of Search ................................ 60/39.02, 752, 60/753, 754, 39.75, 755, 756, 757, 758, 759; 29/889–889.23

(56) References Cited

U.S. PATENT DOCUMENTS

| | | | |
|---|---|---|---|
| 4,966,820 A | * 10/1990 | Kojima et al. ............... 428/622 |
| 5,350,599 A | * 9/1994 | Rigney et al. ........... 427/255.7 |
| 5,682,747 A | * 11/1997 | Brown et al. .................. 60/746 |
| 5,687,679 A | * 11/1997 | Mullin et al. .......... 123/419.79 |
| 5,724,816 A | * 3/1998 | Ritter et al. .................. 60/752 |
| 5,740,668 A | * 4/1998 | Fujiwara et al. ........... 60/39.75 |
| 5,822,853 A | * 10/1998 | Ritter et al. .............. 29/890.01 |
| 5,914,189 A | * 6/1999 | Hasz et al. .................. 428/335 |
| 6,126,400 A | * 10/2000 | Nichols et al. .......... 416/241 B |
| 6,180,184 B1 | * 1/2001 | Gray et al. .................. 427/453 |
| 6,210,488 B1 | * 4/2001 | Bruce ............................. 134/1 |

FOREIGN PATENT DOCUMENTS

WO 99/23273 1/1999

* cited by examiner

*Primary Examiner*—Ted Kim
(74) *Attorney, Agent, or Firm*—Andrew C. Hess; David L. Narciso

(57) ABSTRACT

A method of adjusting airflow through a plurality of cooling holes by depositing a thermal barrier coating on an exterior surface and/or an interior surface of the component by a physical vapor deposition process. The cooling holes are not masked. Thus, a portion of the thermal barrier coating partially obstructs airflow through the cooling holes and reduces airflow through the cooling holes. A predetermined pressure drop is developed across the cooling holes and airflow through the cooling holes is measured. The measured airflow is compared to a preselected range of desired cooling hole airflows and the steps of depositing the thermal barrier coating, developing the predetermined pressure drop, calculating airflow and comparing the measured airflow to the preselected range are repeated until the measured airflow is within the preselected range of desired cooling hole airflows.

11 Claims, 4 Drawing Sheets

METHOD OF ADJUSTING GAS TURBINE COMPONENT COOLING AIR FLOW

BACKGROUND OF THE INVENTION

The present invention relates generally to cooling hole airflow of gas turbine engine components, and more particularly to a method of adjusting cooling hole airflow.

Cooling holes are formed in many gas turbine components for transporting film cooling air through the component to cool the component and to form a fluid barrier between the component and hot gases traveling through a main flowpath of the engine. In addition, some components such as combustion chamber centerbodies are coated with a corrosion inhibiting coating by a conventional flame spray process to prevent the centerbodies from being corrosively attacked by the hot gases traveling through the combustion chamber. The centerbodies are also coated with a thermal barrier coating by a conventional physical vapor deposition process to insulate the centerbodies. After a period of service, the centerbodies are removed from the engine for replacement or repair.

During repair, the corrosion inhibiting coating, thermal barrier coating and contaminants (e.g., combustion products) are removed from the centerbodies by a conventional acid strip process. The strip process removes the coating and contaminants, as well as some base material resulting in the cooling holes being enlarged. Following structural inspection, the centerbodies are recoated with a corrosion inhibiting coating and then recoated with thermal barrier coating. The coated centerbodies are flow checked to determine if the cooling hole airflow is within preselected limits. If the centerbodies pass the flow check, they are returned to service. In the past, no procedure was available to correct airflow if the centerbodies did not pass the flow check during repair or during initial manufacture.

SUMMARY OF THE INVENTION

Among the several features of the present invention may be noted the provision of a method of adjusting airflow through a plurality of cooling holes by depositing a thermal barrier coating on an exterior surface and/or an interior surface of the component by a physical vapor deposition process. The cooling holes are not masked. Thus, a portion of the thermal barrier coating partially obstructs airflow through the cooling holes and reduces airflow through the cooling holes. A predetermined pressure drop is developed across the cooling holes and airflow through the cooling holes is measured. The measured airflow is compared to a preselected range of desired cooling hole airflows and the steps of depositing the thermal barrier coating, developing the predetermined pressure drop, calculating airflow and comparing the measured airflow to the preselected range are repeated until the measured airflow is within the preselected range of desired cooling hole airflows.

In another aspect, the method of the present invention includes the steps of selecting a period of time during which to deposit a second thermal barrier coating based on the measured airflow so airflow through the cooling holes after depositing the second thermal barrier coating is within a preselected range of cooling hole airflows. The second thermal barrier coating is then deposited for the selected period of time.

In yet another aspect, the method of the present invention includes the steps of developing a predetermined pressure drop across the cooling holes and calculating airflow through the cooling holes resulting from the predetermined pressure. The method also includes the step of selecting a period of time during which to deposit a thermal barrier coating based on the measured airflow through the cooling holes so airflow through the cooling holes after depositing the thermal barrier coating is within a preselected range of cooling hole airflows. The thermal barrier coating is deposited on either the exterior surface or the interior surface of the component for the selected period of time by a physical vapor deposition process without masking the cooling holes. Thus, a portion of the thermal barrier coating partially obstructs airflow through the cooling holes and reduces airflow through the cooling holes thereby obtaining airflow through the cooling holes within the preselected range of cooling hole airflows.

Further, the present invention includes a gas turbine engine component comprising a body having a plurality of cooling holes therein. The component has a plurality of layers of thermal barrier coating extending over at least a portion of an interior surface and/or an exterior surface of the component. Each layer of thermal barrier coating at least partially obstructs airflow through the cooling holes to reduce airflow through the cooling holes.

Other features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
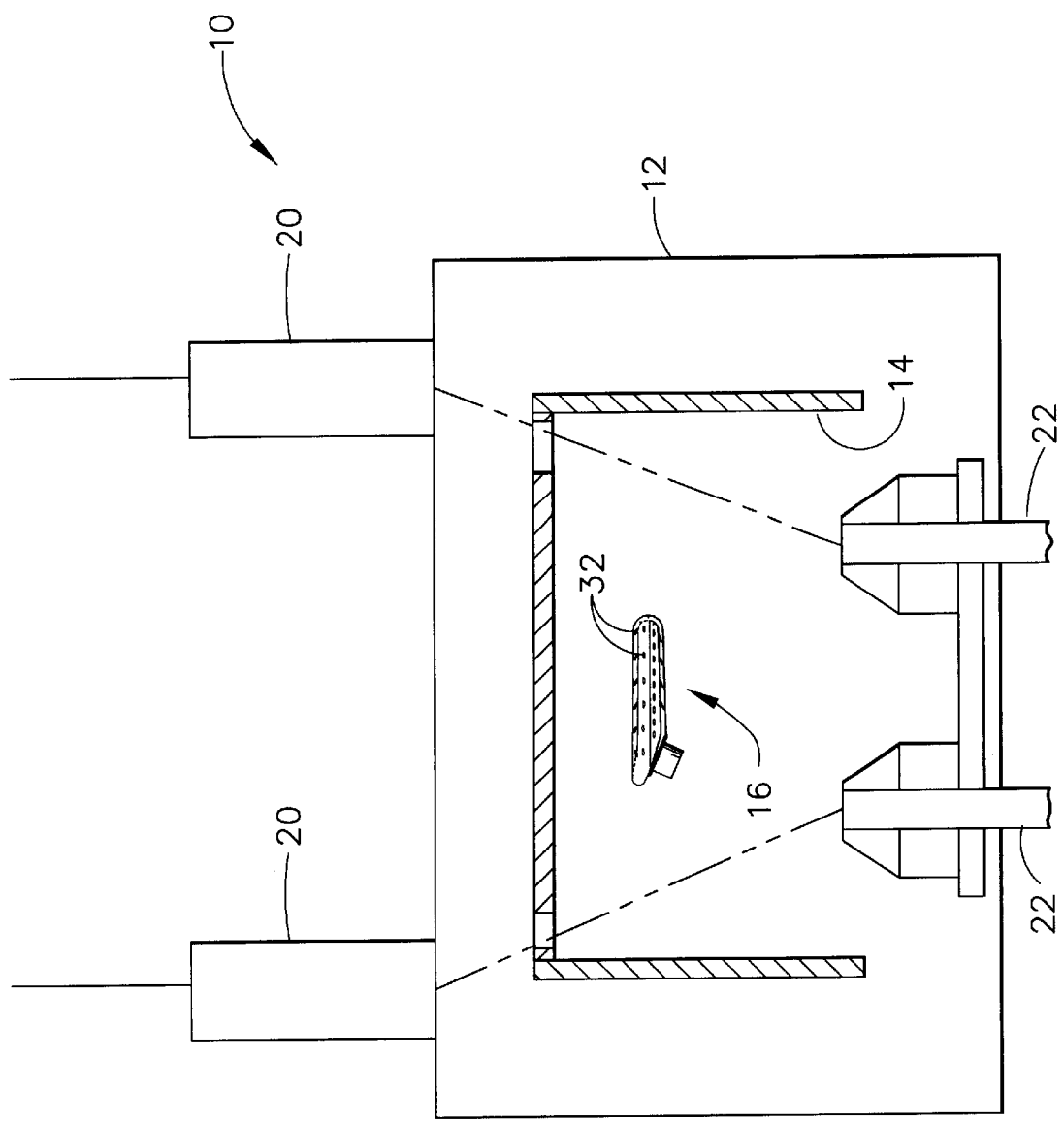
FIG. 1 is a schematic cross section of apparatus for depositing a thermal barrier coating on a gas turbine engine component by physical vapor deposition.

Referring now to the drawings and in particular to FIG. 1, apparatus for depositing a thermal barrier coating by a physical vapor deposition process is designated in its entirety by the reference character 10. The apparatus 10 includes a pressurized enclosure 12 having an interior chamber 14 sized and shaped for receiving a gas turbine engine component, generally designated by 16, such as a combustion chamber centerbody. Electron beam guns 20 provided at the top of the enclosure 12 are aimed at consumable ingots 22 mounted at the bottom of the enclosure 12 to vaporize the ingot material. The vaporized material rises through the interior chamber 14 and deposits on the component 16. Other features of the apparatus 10 including instrumentation, controls and elements for controlling operation of the apparatus are conventional and have been omitted from FIG. 1.

To use the apparatus 10, a component 16 is loaded into the interior chamber 14 of the enclosure 12. The interior chamber 14 of the apparatus 10 is filled with conventional process gases (e.g., 50 percent oxygen and 50 percent argon or 100 percent oxygen), the gases are heated (e.g., to about 1000 degrees Celsius) and the chamber is pressurized (e.g., to a pressure in a range of between about 0.006 millibar and about 0.012 millibar). The electron beam guns 20 are then energized to vaporize the ingot material for a period of time (e.g., between about 55 minutes and about 70 minutes) after which the enclosure 12 is vented before removing the component 16 from the chamber 14.

Figure 2:
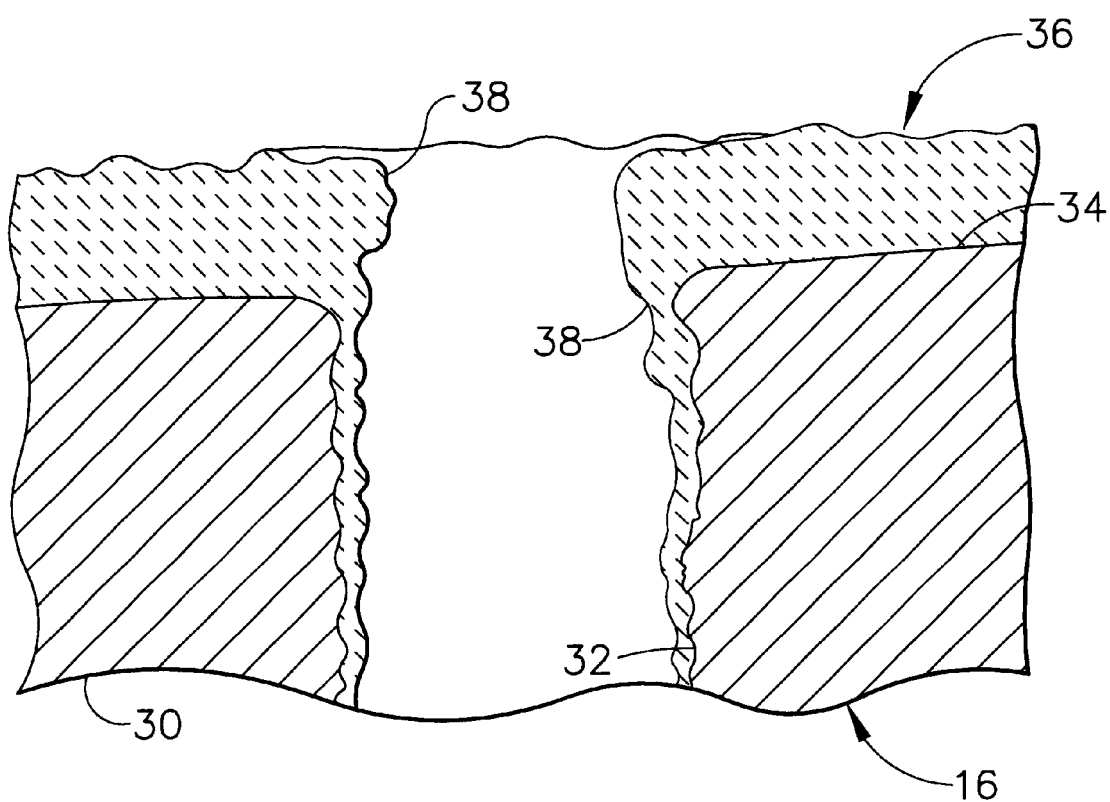
FIG. 2 is a cross section of the component showing one layer of thermal barrier coating partially blocking flow through a cooling hole.

As illustrated in FIG. 2, the gas turbine engine component 16 has a body 30 with cooling holes 32 extending from an interior surface (not shown) of the component to an exterior surface 34 of the component. The apparatus 10 (FIG. 1) deposits a layer of thermal barrier coating, generally designated by 36, on the exterior surface 34 and the interior surface of the component 16 by a physical vapor deposition process. Because the cooling holes 32 are not masked during the physical vapor deposition process, a portion 38 of the thermal barrier coating 36 partially obstructs airflow through the cooling holes and coats the inside of the cooling holes, This portion 38 of the thermal barrier coating 36 reduces airflow through the cooling holes.

Figure 3:
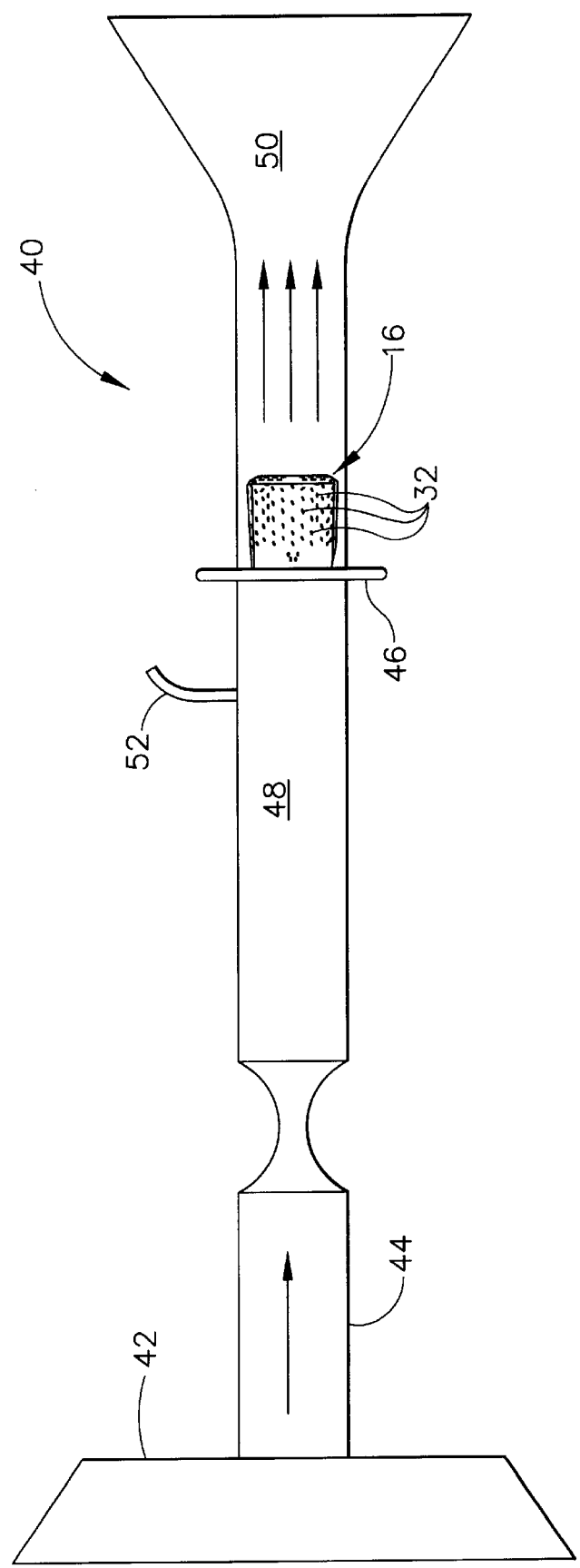
FIG. 3 is a schematic cross section of apparatus for measuring airflow through cooling holes of the gas turbine engine component.

As shown in FIG. 3, a pressure flow stand, generally designated by 40, is used to flow check the component 16 after depositing the thermal barrier coating 36 on the component. The stand 40 includes a compressor 42 connected to a duct 44. The component 16 is mounted on a bulkhead 46 positioned along the duct 44. An end of the duct opposite the compressor 42 is open. Thus, an end of the duct 48 upstream from the bulkhead 46 is pressurized and an end of the duct 50 downstream from the bulkhead 46 is at ambient pressure. As a result of the difference in upstream and downstream pressures, a pressure drop develops across the cooling holes 32 in the component 16. A pressure probe 52 connected to the duct 48 measures pressure upstream from the bulkhead 46. Because pressures on each side of the bulkhead 46 are known, airflow through the cooling holes can be calculated. This airflow is compared to a preselected range of desired cooling hole airflows. If the airflow is within the preselected range of desired cooling hole airflows and the component 16 otherwise meets component specifications, it is returned to service.

If, however, the airflow is above the preselected range of desired cooling hole airflows, the component 16 is loaded into the physical vapor deposition apparatus 10 and additional thermal barrier coating 36 is deposited on the component. Typically, during this second deposition step the electron beam guns 20 are energized for a shorter period of time (e.g., between about 15 minutes and 30 minutes) than during the first deposition step. The coated component 16 is removed from the physical vapor deposition apparatus 10 and loaded into the pressure stand 40. Airflow through the cooling holes 32 is measured as before and the measured airflow is again compared to the preselected range. In one preferred embodiment of the present invention, these steps are repeated until the measured airflow is within the preselected range of desired cooling hole airflows. In a second preferred embodiment of the present invention, the time period during which the thermal barrier coating is deposited when repeating the steps is selected based on the measured airflow. It is envisioned that this time period can be determined from experience, and can be derived using empirical formulas. Preferably, the step of depositing the thermal barrier coating need be repeated no more than once during the second preferred embodiment. In a third preferred embodiment of the present invention, the time period during which the thermal barrier coating is deposited is determined before depositing the thermal barrier coating so the step of depositing the thermal barrier coating is performed only once.

The minimum airflow of the preselected range of desired cooling airflows is selected to provide sufficient airflow through the cooling holes 32 to maintain the component 16 below a selected maximum temperature during engine operation. This maximum temperature is calculated to provide an environment in which component life requirements will be met. The maximum airflow of the range is selected to ensure sufficient cooling airflow through other components within the gas turbine engine to maintain the other components below maximum temperatures at which their respective life requirements are met.

Figure 4:
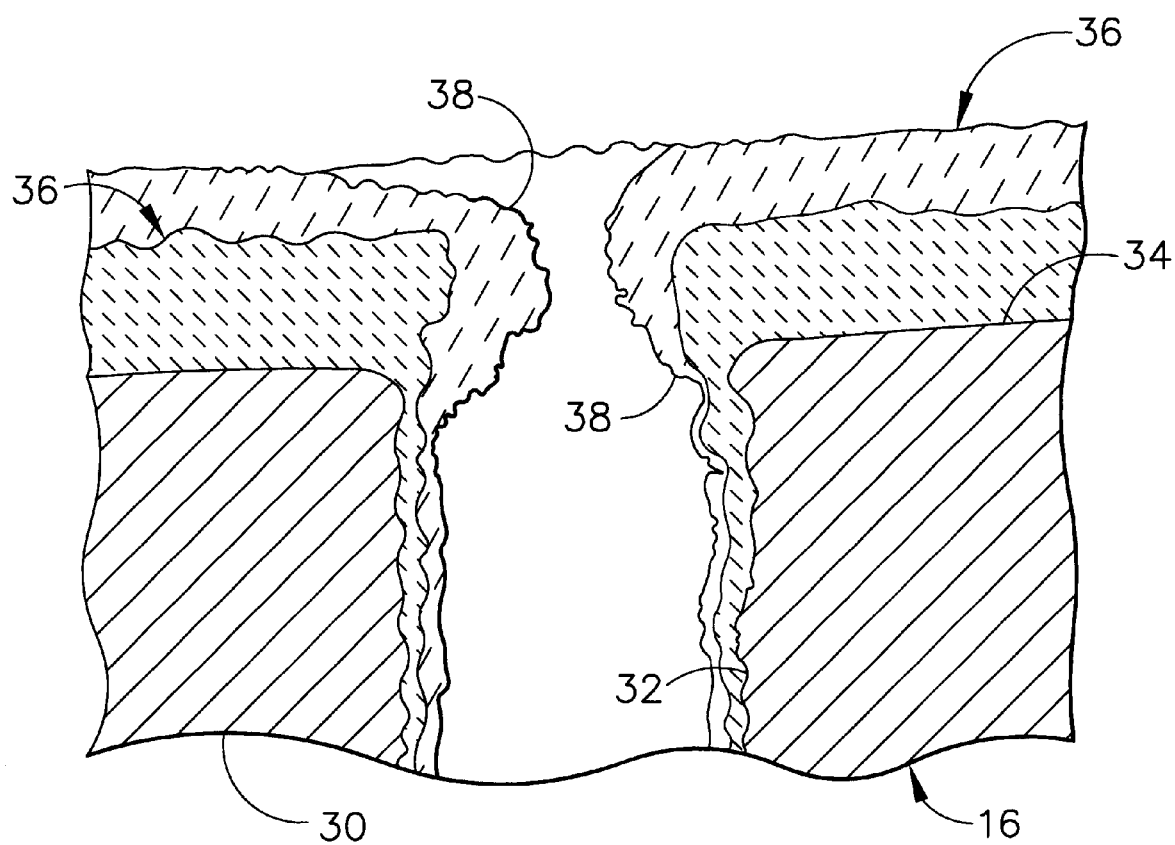
FIG. 4 is a cross section of the component showing two layers of thermal barrier coating.

As illustrated in FIG. 4, the method described above provides a gas turbine engine component 16 (FIG. 2) having more than one (and preferably only two) layer(s) of thermal barrier coating 36 applied to at least a portion of at least one of the surfaces of the component. Each of these layers of thermal barrier coating 36 at least partially obstructs the cooling holes 32 thereby reducing airflow through the cooling holes. For example, during initial testing, eighty percent of the tested centerbodies had airflows nominally five percent above maximum allowable flow after a first coating 36 was applied. After a second coating 36 was applied, the centerbody airflows were reduced by about eight percent and were within specifications.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A method of adjusting airflow through a plurality of cooling holes extending through a gas turbine engine component from an interior surface of the component to an exterior surface of the component, the method comprising the steps of:

depositing a thermal barrier coating on at least one of the exterior surface and the interior surface of the component by a physical vapor deposition process without masking said plurality of cooling holes thereby permitting a portion of the thermal barrier coating to partially obstruct airflow through said plurality of cooling holes and reducing airflow through said plurality of cooling holes;

developing a predetermined pressure drop across said plurality of cooling holes after depositing the thermal barrier coating on the component;

calculating airflow through said plurality of cooling holes resulting from the predetermined pressure drop across said plurality of cooling holes;

comparing the calculated airflow through said plurality of cooling holes to a preselected range of desired cooling hole airflows; and repeating the steps of depositing the thermal barrier coating, developing the predetermined pressure drop, calculating airflow and comparing the calculated airflow to the preselected range until the calculated airflow is within the preselected range of desired cooling hole airflows.

2. A method as set forth in claim 1 wherein said preselected range of desired cooling hole airflows includes a minimum airflow selected to provide sufficient airflow through said plurality of cooling holes to maintain the component below a maximum temperature at which component life requirements are met.

3. A method as set forth in claim 1 wherein said preselected range of desired cooling hole airflows includes a maximum airflow selected to ensure sufficient cooling airflow through other components within the gas turbine engine to maintain said other components below maximum temperatures at which their respective life requirements are met.

4. A method as set forth in claim 1 wherein the step of repeating the steps is performed only once.

5. A method as set forth in claim 1 wherein when repeating the steps the thermal barrier coating is deposited for a period of time which is selected based on the calculated airflow through said plurality of cooling holes.

6. A method of adjusting airflow through a plurality of cooling holes extending through a gas turbine engine component from an interior surface of the component to an exterior surface of the component, the method comprising the steps of:

depositing a thermal barrier coating on at least one of the exterior surface and the interior surface of the component by a physical vapor deposition process without masking said plurality of cooling holes thereby permitting a portion of the thermal barrier coating to partially obstruct airflow through said plurality of cooling holes and reducing airflow through said plurality of cooling holes;

developing a predetermined pressure drop across said plurality of cooling holes after depositing the thermal barrier coating on the component;

calculating airflow through said plurality of cooling holes resulting from the predetermined pressure drop across said plurality of cooling holes;

selecting a period of time during which to deposit a second thermal barrier coating based on the calculated airflow through said plurality of cooling holes so airflow through said plurality of cooling holes after depositing said second thermal barrier coating is within a preselected range of cooling hole airflows; and depositing said second thermal barrier coating for the selected period of time thereby obtaining airflow through said plurality of cooling holes within the preselected range of cooling hole airflows.

7. A method as set forth in claim 6 wherein said preselected range of desired cooling hole airflows includes a minimum airflow selected to provide sufficient airflow through said plurality of cooling holes to maintain the component below a maximum temperature at which component life requirements are met.

8. A method as set forth in claim 6 wherein said preselected range of desired cooling hole airflows includes a maximum airflow selected to ensure sufficient cooling airflow through other components within the gas turbine engine to maintain said other components below maximum temperatures at which their respective life requirements are met.

9. A method of adjusting airflow through a plurality of cooling holes extending through a gas turbine engine component from an interior surface of the component to an exterior surface of the component, the method comprising the steps of:

developing a predetermined pressure drop across said plurality of cooling holes;

calculating airflow through said plurality of cooling holes resulting from the predetermined pressure drop across said plurality of cooling holes;

selecting a period of time during which to deposit a thermal barrier coating based on the measured airflow through said plurality of cooling holes so airflow through said plurality of cooling holes after depositing said thermal barrier coating is within a preselected range of cooling hole airflows; and depositing the thermal barrier coating on at least one of the exterior surface and the interior surface of the component for the selected period of time by a physical vapor deposition process without masking said plurality of cooling holes thereby permitting a portion of the thermal barrier coating to partially obstruct airflow through said plurality of cooling holes and reducing airflow through said plurality of cooling holes thereby obtaining airflow through said plurality of cooling holes within the preselected range of cooling hole airflows.

10. A method as set forth in claim 9 wherein said preselected range of desired cooling hole airflows includes a minimum airflow selected to provide sufficient airflow through said plurality of cooling holes to maintain the component below a maximum temperature at which component life requirements are met.

11. A method as set forth in claim 9 wherein said preselected range of desired cooling hole airflows includes a maximum airflow selected to ensure sufficient cooling airflow through other components within the gas turbine engine to maintain said other components below maximum temperatures at which their respective life requirements are met.

* * * * *